US008432237B2

(12) United States Patent
Klemens et al.

(10) Patent No.: US 8,432,237 B2
(45) Date of Patent: Apr. 30, 2013

(54) OUTPUT CIRCUIT WITH INTEGRATED IMPEDANCE MATCHING, POWER COMBINING AND FILTERING FOR POWER AMPLIFIERS AND OTHER CIRCUITS

(75) Inventors: Guy Klemens, San Diego, CA (US); Nathan M Pletcher, Encinitas, CA (US); Babak Nejati, San Diego, CA (US); Norman L Frederick, Vista, CA (US); Thomas A Myers, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 452 days.

(21) Appl. No.: 12/541,831

(22) Filed: Aug. 14, 2009

(65) Prior Publication Data

US 2010/0295629 A1     Nov. 25, 2010

Related U.S. Application Data

(60) Provisional application No. 61/180,375, filed on May 21, 2009.

(51) Int. Cl.
    *H01P 5/12*     (2006.01)
    *H03H 7/38*     (2006.01)
(52) U.S. Cl.
    USPC .......................... 333/126; 333/129; 333/132
(58) Field of Classification Search .......... 333/126–129, 333/132
See application file for complete search history.

(56) References Cited

U.S. PATENT DOCUMENTS

| 5,754,082 | A | 5/1998 | Swanson |
| 5,939,939 | A | 8/1999 | Gaynor et al. |
| 5,974,041 | A | 10/1999 | Kornfeld et al. |
| 6,069,525 | A | 5/2000 | Sevic et al. |

(Continued)

FOREIGN PATENT DOCUMENTS

| EP | 1100147 | 5/2001 |
| JP | 2003046452 A | 2/2003 |
| WO | WO2004112237 | 12/2004 |

OTHER PUBLICATIONS

Kyu Hwan An et al; "Power-Combining Transformer Techniques for Fully-Integrated CMOS Power Amplifiers", Solid-State Circuits, IEEE Journal of; vol. 43, Issue 5, May 2008 pp. 1064-1075.

(Continued)

*Primary Examiner* — Robert Pascal
*Assistant Examiner* — Kimberly Glenn
(74) *Attorney, Agent, or Firm* — Ramin Mobarhan

(57) ABSTRACT

An output circuit with integrated impedance matching, power combining, and filtering and suitable for use with power amplifiers and other circuits is described. In an exemplary design, an apparatus may include first and second circuits (e.g., power amplifiers) and an output circuit. The first circuit may provide a first single-ended signal and may have a first output impedance. The second circuit may provide a second single-ended signal and may have a second output impedance. The output circuit may include (i) first and second matching circuits that perform output impedance matching and filtering for the first and second circuits, (ii) a combiner (e.g., a summing node) that combines the first and second single-ended signals to obtain a combined single-ended signal, (iii) a third matching circuit that performs impedance matching and filtering for the combined single-ended signal, and (iv) switches to route the single-ended signals to different outputs.

31 Claims, 8 Drawing Sheets

U.S. PATENT DOCUMENTS

| | | | |
|---|---|---|---|
| 6,489,877 B1 * | 12/2002 | Yamamoto et al. | 336/200 |
| 7,030,714 B2 * | 4/2006 | Korol | 333/124 |
| 7,671,693 B2 * | 3/2010 | Brobston et al. | 333/17.3 |
| 2003/0022638 A1 | 1/2003 | Imai et al. | |
| 2005/0088253 A1 | 4/2005 | Yoon et al. | |
| 2008/0079513 A1 | 4/2008 | Prikhodko et al. | |
| 2010/0117738 A1 | 5/2010 | Korden | |

OTHER PUBLICATIONS

Aoki, I. et al. "A Fully-Integrated Quad-Band GSM/GPRS CMOS Power Amplifier", Solid-State Circuits, IEEE Journal of; vol. 43, Issue 12, Dec. 2008 pp. 2747-2758.

Abernathy P C, et al., "Ku-band solid state power amplifier for Geosat follow-on" IEEE Southeastcon '96. Bringing Together Education, Science and Technology, Apr. 11, 1996, pp. 277-280, XP010163688, section "Power Amplifier Evolution"; figure 2.

Alireza Shirvani, et al., "A CMOS RF Power Amplifier With Parallel Amplification for Efficient Power Control" IEEE Journal of Solid-State Circuits, vol. 37, No. 6, Jun. 1, 2002, XP011065782, pp. 684-693.

Crescenzi E J, et al., "60 watt doherty amplifiers using high gain 2-stage hybrid amplifier modules" 2005 IEEE MTT-S International Microwave Symposium, Jun. 12, 2005, pp. 1383-1386, XP010844890.

International Search Report and Written Opinion—PCT/US2010/035861, International Search Authority—European Patent Office—Aug. 20, 2010.

* cited by examiner

US 8,432,237 B2

OUTPUT CIRCUIT WITH INTEGRATED IMPEDANCE MATCHING, POWER COMBINING AND FILTERING FOR POWER AMPLIFIERS AND OTHER CIRCUITS

CLAIM OF PRIORITY UNDER 35 U.S.C. §119

The present Application for patent claims priority to Provisional Application Ser. No. 61/180,375, entitled "OUTPUT CIRCUIT WITH INTEGRATED IMPEDANCE MATCHING, POWER COMBINING AND FILTERING FOR POWER AMPLIFIERS AND OTHER CIRCUITS," filed May 21, 2009, assigned to the assignee hereof, and expressly incorporated herein by reference.

BACKGROUND

I. Field

The present disclosure relates generally to electronics, and more specifically to an output circuit for power amplifiers and other circuits.

II. Background

A power amplifier is an amplifier that can provide high output power for a signal to be transmitted. Power amplifiers are used in virtually all wireless communication systems to provide amplification and output drive for signals prior to transmission over the air. For example, power amplifiers are used in Code Division Multiple Access (CDMA) systems such as CDMA 1X systems and Wideband-CDMA (W-CDMA) systems, Time Division Multiple Access (TDMA) systems such as Global System for Mobile Communications (GSM) systems, etc. Power amplifiers are used in wireless devices as well as base stations.

Power amplifiers are typically required to meet various system specifications for output power level, harmonics attenuation, etc. CDMA and GSM systems also require a wireless device to be able to transmit at a high maximum power level (e.g., +33 dBm for GSM and +27 dBm for CDMA) and to adjust its transmit power over a wide range (e.g., 30 dB or more for GSM and more than 70 dB for CDMA). Power amplifiers and supporting circuits that can provide the required performance with low power and small area are highly desirable.

DETAILED DESCRIPTION

The word "exemplary" is used herein to mean "serving as an example, instance, or illustration." Any design described herein as "exemplary" is not necessarily to be construed as preferred or advantageous over other designs.

An output circuit with integrated impedance matching, power combining, and filtering and suitable for use with power amplifiers and other circuits is described herein. The output circuit may be used for various electronics devices such as wireless communication devices, cellular phones, personal digital assistants (PDAs), handheld devices, wireless modems, laptop computers, cordless phones, broadcast receivers, Bluetooth devices, consumer electronics devices, etc. For clarity, the use of the output circuit with power amplifiers in a wireless communication device is described below.

Figure 1:
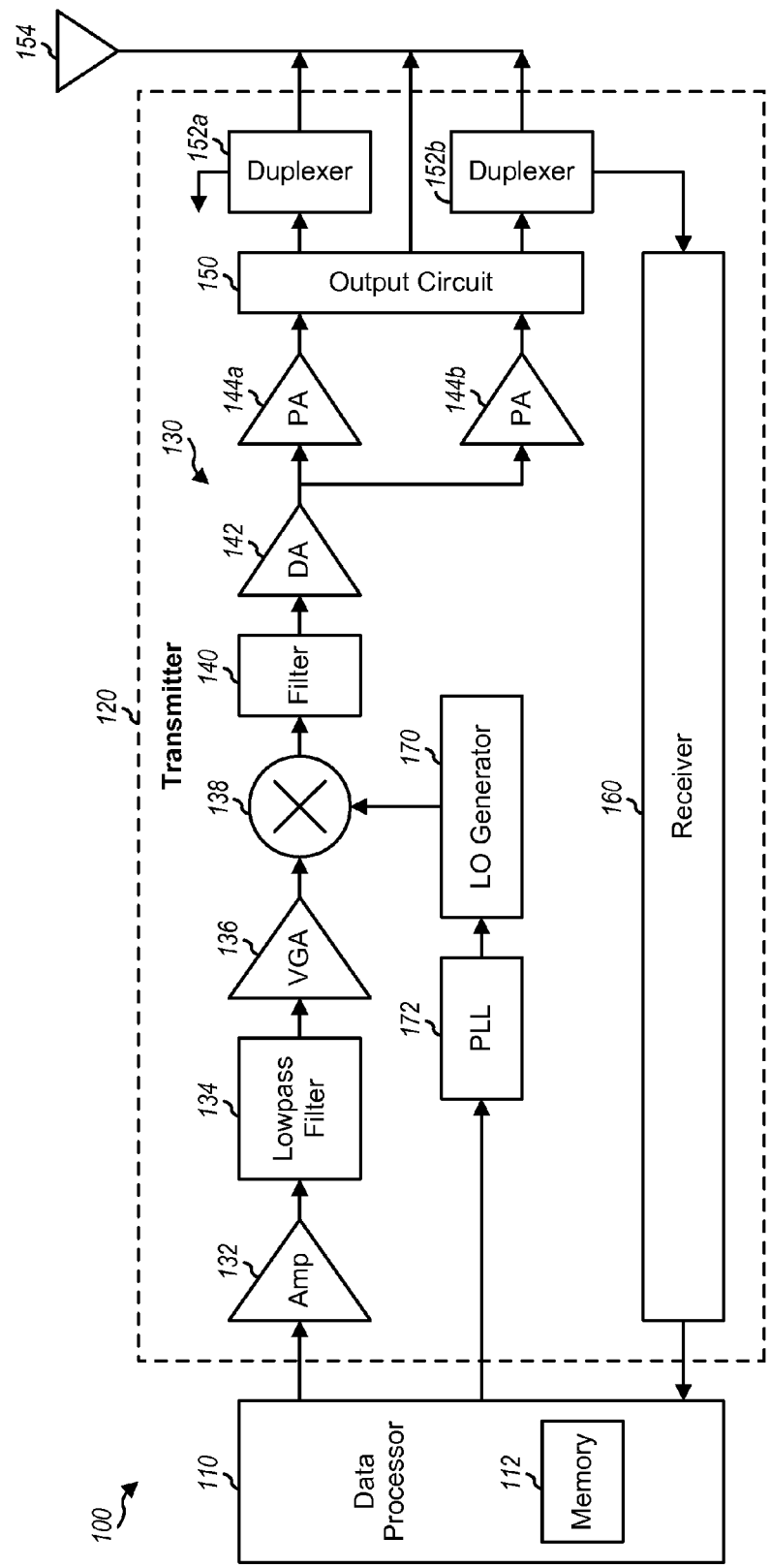
FIG. 1 shows a block diagram of a wireless communication device.

FIG. 1 shows a block diagram of an exemplary design of a wireless communication device 100. In this exemplary design, wireless device 100 includes a data processor 110 and a transceiver 120. Transceiver 120 includes a transmitter 130 and a receiver 160 that support bi-directional wireless communication. In general, wireless device 100 may include any number of transmitters and any number of receivers for any number of communication systems and any number of frequency bands.

In the transmit path, data processor 110 processes data to be transmitted and provides an analog output signal to transmitter 130. Within transmitter 130, the analog output signal is amplified by an amplifier (Amp) 132, filtered by a lowpass filter 134 to remove images caused by digital-to-analog conversion, amplified by a variable gain amplifier (VGA) 136, upconverted from baseband to radio frequency (RF) by an upconverter 138, and filtered by a filter 140 to remove images caused by the frequency upconversion.

In the exemplary design shown in FIG. 1, a driver amplifier (DA) 142 amplifies the signal from filter 140 and provides its output signal to two power amplifiers (PA) 144a and 144b. Each power amplifier 144 amplifies its input signal and provides an output RF signal to an output circuit 150. In general, transmitter 130 may include any number of power amplifiers, e.g., two, three, four, or more power amplifiers. For simplicity, much of the description below assumes two power amplifiers 144a and 144b. Output circuit 150 receives the output RF signals from power amplifiers 144a and 144b, provides a first transmit RF signal to a duplexer 152a, provides a second transmit RF signal directly to an antenna 154, and provides a third transmit RF signal to a duplexer 152b. Each duplexer 152 routes its transmit RF signal from output circuit 150 to antenna 154 and also routes a received RF signal from antenna 154 to receiver 160. Details of receiver 160 are not shown in FIG. 1 for simplicity. Duplexers 152a and 152b may operate at two different frequencies in a given frequency band, e.g., cellular band or PCS band.

FIG. 1 shows an exemplary design in which output circuit 150 is coupled to two duplexers 152a and 152b and also to antenna 154. A duplexer may be used to support frequency division duplexing (FDD), which is utilized in CDMA 1X and WCDMA. Direct connection to antenna (without a duplexer) may be used for time division duplexing (TDD), which is utilized in GSM. In general, output circuit 150 may be coupled (i) to one or more duplexers 152 and also to antenna 154, as shown in FIG. 1, or (ii) to only antenna 154 and no duplexers, or (iii) to only duplexers and not directly to antenna 154, or (iv) to some other circuits. For clarity, much of the description below assumes the exemplary design shown in FIG. 1, with output circuit 150 being coupled to two duplexers 152a and 152b and also to antenna 154.

A local oscillator (LO) generator 170 generates and provides an LO signal to upconverter 138. A phase locked loop (PLL) 172 receives control information from data processor 110 and provides control signals to LO generator 170 to generate the LO signal at the proper frequency.

FIG. 1 shows an exemplary design of transmitter 130. In general, the conditioning of the signals in transmitter 130 may be performed by one or more stages of amplifier, filter, mixer, etc. These circuit blocks may be arranged differently from the configuration shown in FIG. 1. Furthermore, other circuit blocks not shown in FIG. 1 may also be used to condition the signals in the transmitter. Some circuit blocks in FIG. 1 may also be omitted. All or a portion of transmitter 130 may be implemented on an analog integrated circuit (IC), an RF IC (RFIC), a mixed-signal IC, etc. For example, driver amplifier 142, power amplifiers 144a and 144b, output circuit 150 and possibly other circuits in transmitter 130 may be implemented on an RFIC.

Data processor 110 may perform various functions for wireless device 100, e.g., processing for transmitted and received data. A memory 112 may store program codes and data for data processor 110. Data processor 110 may be implemented on one or more application specific integrated circuits (ASICs) and/or other ICs.

Driver amplifier 142 and power amplifiers 144a and 144b may be implemented with various designs. It may be desirable to implements driver amplifier 142 and power amplifiers 144a and 144b in complementary metal oxide semiconductor (CMOS) in order to obtain various advantages such as lower power consumption, lower cost, etc.

Figure 2:
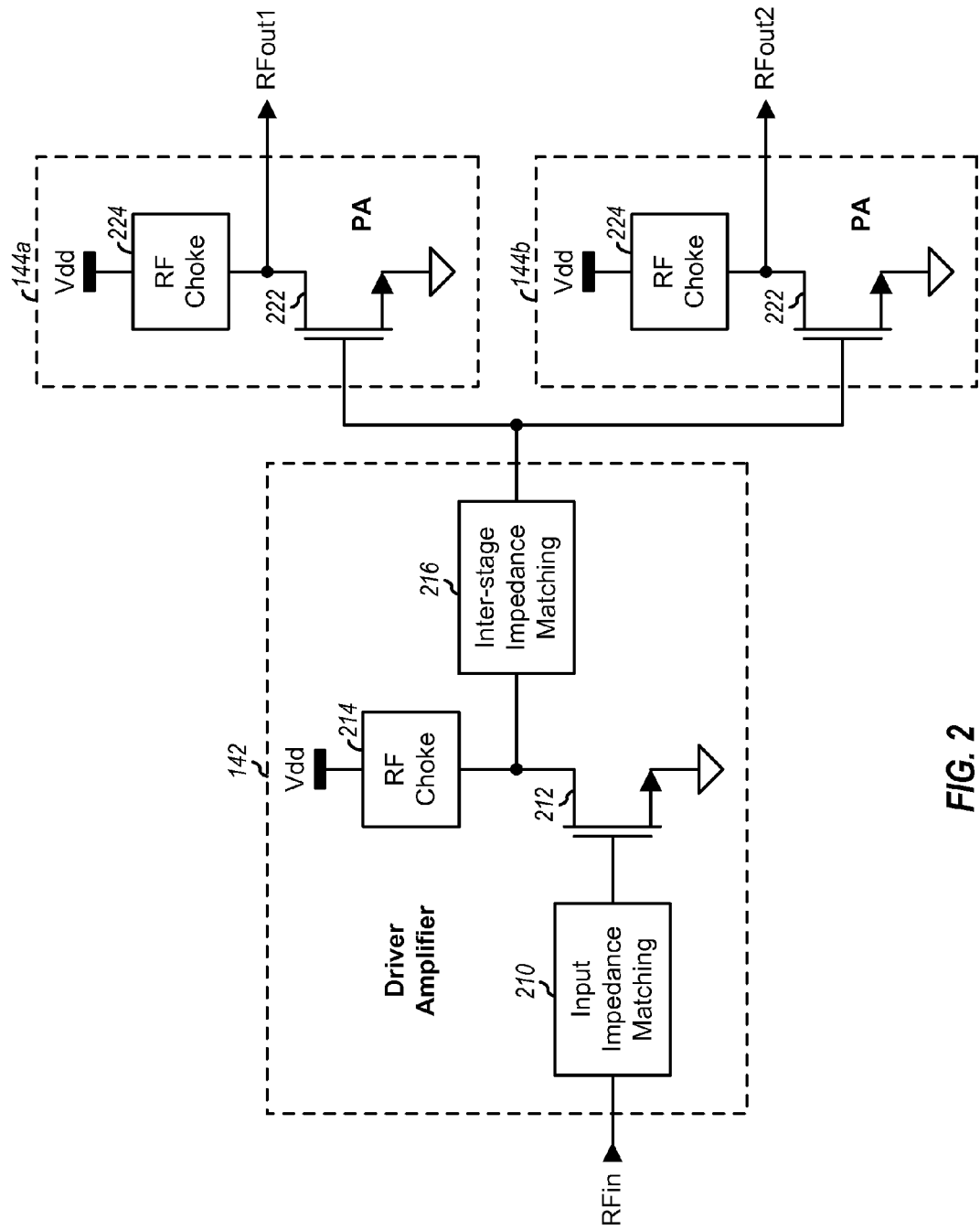
FIG. 2 shows a schematic diagram of a driver amplifier and two power amplifiers.

FIG. 2 shows a schematic diagram of an exemplary design of driver amplifier 142 and power amplifiers 144a and 144b. Within driver amplifier 142, an input impedance matching circuit 210 has one end receiving the input RF signal (RFin) for driver amplifier 142 and the other end coupled to the gate of an N-channel metal oxide semiconductor (NMOS) transistor 212. Circuit 210 performs input impedance matching for driver amplifier 142. NMOS transistor 212 has is source coupled to circuit ground and its drain coupled to an interstage impedance matching circuit 216. An RF choke 214 is coupled between a power supply, Vdd, and the drain of NMOS transistor 212. Circuit 216 performs impedance matching between driver amplifier 142 and power amplifiers 144a and 144b.

Within each power amplifier 144, an NMOS transistor 222 has its gate coupled to matching circuit 216, its source coupled to circuit ground, and its drain providing an output RF signal for the power amplifier. An RF choke 224 is coupled between the Vdd supply and the drain of NMOS transistor 222. Power amplifiers 144a and 144b are implemented with a single-ended design, which may reduce power consumption over a differential design. Each power amplifier 144 provides a single-ended output RF signal.

FIG. 2 shows an exemplary design of driver amplifier 142 and power amplifiers 144a and 144b using a single NMOS transistor for each amplifier. In general, driver amplifier 142 and power amplifiers 144a and 144b may each include any number of MOS transistors, which may be coupled in various manners. A MOS transistor may be an NMOS transistor or a PMOS transistor. In another exemplary design, an amplifier may comprise two MOS transistors coupled in a cascode configuration. One MOS transistor may provide signal gain, and the other MOS transistor may provide buffering and signal drive. In yet another exemplary design, an amplifier may comprise multiple MOS transistors stacked together, so that the drain of one MOS transistor is coupled to the source of another MOS transistor. Each MOS transistor may be designed to observe a fraction of the signal swing across its drain and source. This may avoid breakdown of the MOS transistors and may improve reliability. The number of MOS transistors to stack may be dependent on the maximum output power level, which may be dependent on system requirements. For example, three MOS transistors may be stacked for high maximum output power (e.g., +33 dBm for GSM in cellular band) and two MOS transistors may be stacked for lower maximum output power (e.g., +27 dBm for CDMA in PCS band).

Figure 3:
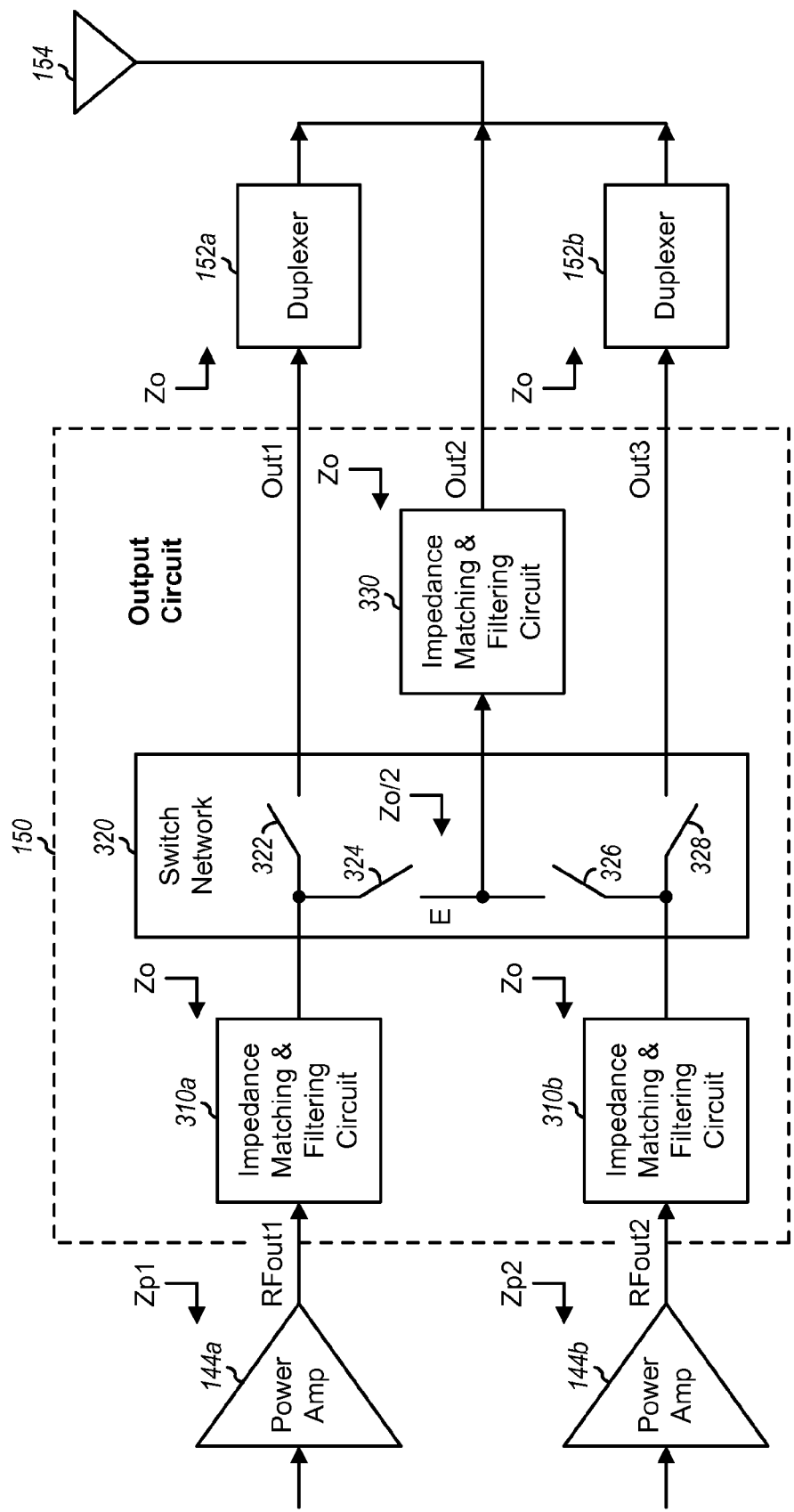
FIG. 3 shows a block diagram of an output circuit.

FIG. 3 shows a block diagram of an exemplary design of output circuit 150 in FIG. 1. In this exemplary design, output circuit 150 performs impedance matching, power combining, filtering, and switching for power amplifiers 144a and 144b.

In the exemplary design shown in FIG. 3, output circuit 150 includes impedance matching and filtering circuits 310a and 310b, a switch network 320, and an impedance matching and filtering circuit 330. An impedance matching and filtering circuit may also be referred to as simply a matching circuit. Matching circuit 310a is coupled between the output of power amplifier 144a and switch network 320. Matching circuit 310b is coupled between the output of power amplifier 144b and switch network 320. Matching circuit 330 is coupled between switch network 320 and antenna 154. Switch network 320 is further coupled to duplexers 152a and 152b.

Power amplifier 144a may have an output impedance of Zp1, and power amplifier 144b may have an output impedance of Zp2. Zp1 and Zp2 may each be any real or complex value and may or may not be equal to one another. Matching circuit 310a performs impedance matching for power amplifier 144a and has an input impedance of approximately Zp1 and an output impedance of approximately Zo, which may be any suitable real of complex value, e.g., Zo≈50 Ohms or some other value. Matching circuit 310a also filters the output RF signal (RFout1) from power amplifier 144a to attenuate unwanted harmonics. Similarly, matching circuit 310b performs impedance matching for power amplifier 144b and has an input impedance of approximately Zp2 and an output impedance of approximately Zo. Matching circuit 310b also filters the output RF signal (RFout2) from power amplifier 144b to attenuate unwanted harmonics.

Switch network 320 routes the output RF signals from power amplifiers 144a and 144b to duplexer 152a, duplexer 152b, or antenna 154. Within switch network 320, a switch 322 is coupled between matching circuit 310a and a first output (Out1) of output circuit 150, which is coupled to duplexer 152a. A switch 324 is coupled between matching circuit 310a and matching circuit 330, and a switch 326 is coupled between matching circuit 310b and matching circuit 330. Matching circuit 330 is further coupled to a second output (Out2) of output circuit 150, which is coupled to antenna 154. A switch 328 is coupled between matching circuit 310b and a third output (Out3) of output circuit 150, which is coupled to duplexer 152b. Switches 322 to 328 may be implemented with MOS transistors, MOS transmission gates, micro-electro-mechanical system (MEMS) switches, etc.

Output circuit 150 may support multiple modes of operation, which may be referred to as transmit modes. In a first transmit mode, switch 322 is closed, and switches 324, 326 and 328 are opened. The output RF signal from power amplifier 144a is then routed to duplexer 152a and transmitted via antenna 154. In a second transmit mode, switch 324 and 326 are closed, and switches 322 and 328 are opened. The output RF signals from power amplifiers 144a and 144b are combined at node E, and the combined output RF signal is passed through matching circuit 330 and transmitted via antenna 154. In a third transmit mode, switch 328 is closed, and switches 322, 324 and 326 are opened. The output RF signal from power amplifier 144b is then routed to duplexer 152b and transmitted via antenna 154.

As shown in FIG. 3, each power amplifier 144 may provide its single-ended output RF signal directly to the associated duplexer 152 when lower output power is needed. The single-ended outputs of power amplifiers 144a and 144b may be combined by simply tying the two outputs of matching circuits 310a and 310b when higher output power is needed. Lower output power may be needed by certain systems such as CDMA systems. Higher output power may be needed by other systems such as GSM systems.

Matching circuit 330 performs impedance matching when power amplifiers 144a and 144b are combined. When switches 324 and 326 are closed, the impedance looking back to matching circuits 310a and 310b from node E is approximately Zo/2. Matching circuit 330 thus has an input impedance of approximately Zo/2 and an output impedance of approximately Zo. Matching circuit 330 also filters the combined output RF signal to attenuate unwanted harmonics.

Figure 4:
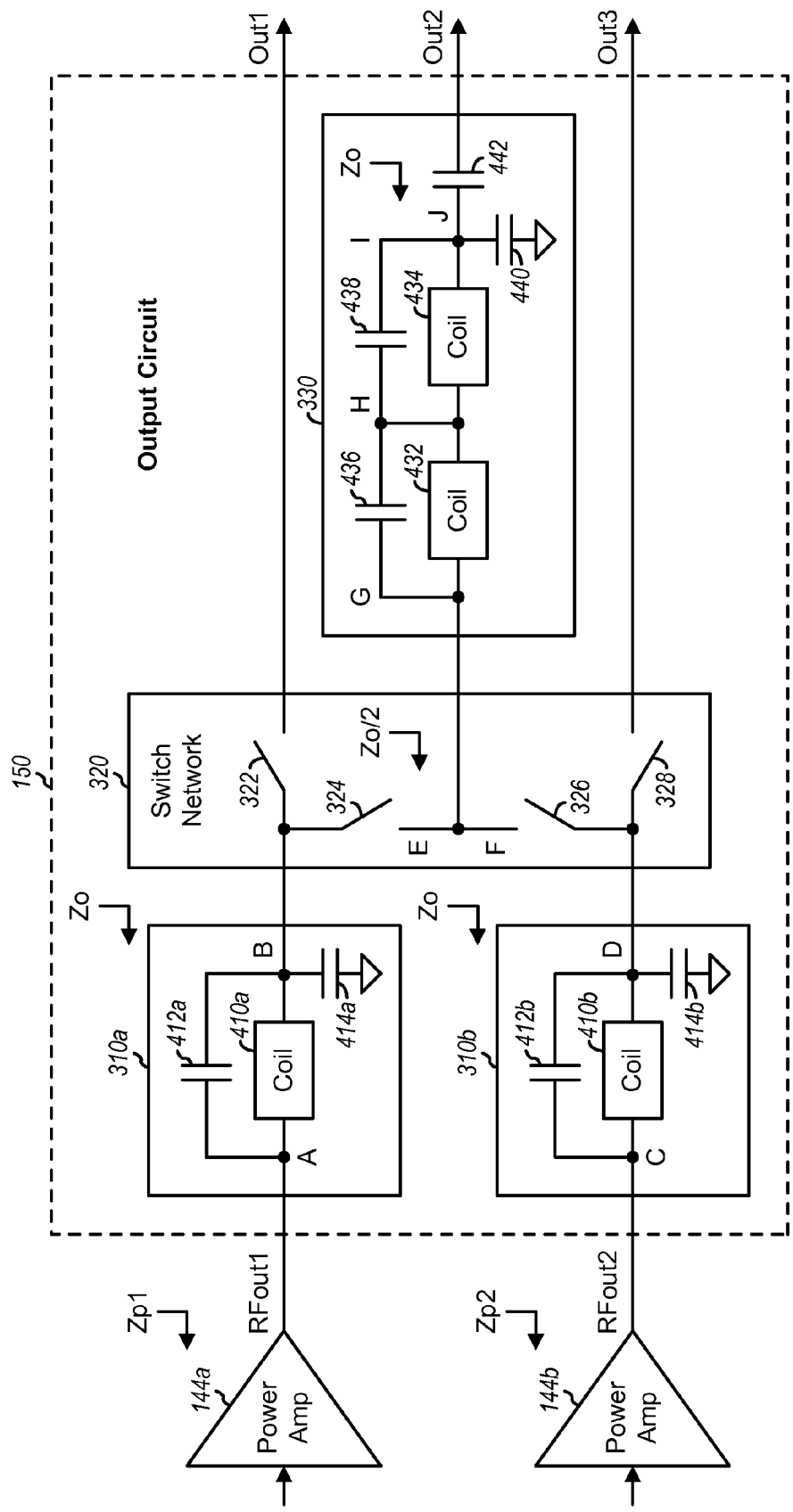
FIG. 4 shows a schematic diagram of matching circuits within the output circuit.

FIG. 4 shows a schematic diagram of an exemplary design of matching circuits 310a, 310b and 330 within output circuit 150 in FIG. 3. Within matching circuit 310a, a coil 410a and a capacitor 412a are coupled in parallel, and the combination is coupled between nodes A and B. A coil may also be referred to as an inductor, a winding, a conductor, etc. A capacitor 414a is coupled between node B and circuit ground. Node A is the input of matching circuit 310a and is coupled to the output of power amplifier 144a. Node B is the output of matching circuit 310a and is coupled to switches 322 and 324. The values of coil 410a and capacitors 412a and 414a may be selected to obtain an input impedance of approximately Zp1, an output impedance of approximately Zo, and the desired filtering of the output RF signal from power amplifier 144a.

Within matching circuit 310b, a coil 410b and a capacitor 412b are coupled in parallel, and the combination is coupled between nodes C and D. A capacitor 414b is coupled between node D and circuit ground. Node C is the input of matching circuit 310b and is coupled to the output of power amplifier 144b. Node D is the output of matching circuit 310b and is coupled to switches 326 and 328. The values of coil 410b and capacitors 412b and 414b may be selected to obtain an input impedance of approximately Zp2, an output impedance of approximately Zo, and the desired filtering of the output RF signal from power amplifier 144b. Although not shown in FIG. 4, a resistor may be coupled between nodes A and C to form a Wilkinson power combiner/divider, which may improve isolation between nodes A and C.

Within matching circuit 330, coils 432 and 434 are coupled in series and between the input of matching circuit 330 and node J. A capacitor 436 is coupled in parallel with coil 432, and a capacitor 438 is coupled in parallel with coil 434. A capacitor 440 is coupled between node J and circuit ground. An AC coupling capacitor 442 is coupled between node J and the output of matching circuit 330. The values of coils 432 and 434 and capacitors 436, 438 and 440 may be selected to obtain an input impedance of approximately Zo/2, an output impedance of approximately Zo, and the desired filtering of the combined output RF signal from power amplifiers 144a and 144b.

FIG. 4 shows an exemplary design in which matching circuits 310a and 310b each includes one filter stage, and matching circuit 330 includes two filter stages. Each filter stage includes a coil and a capacitor coupled in parallel and providing filtering. Each filter stage may also include a shunt capacitor to circuit ground (e.g., capacitor 414a, 414b or 440) at the output of the filter stage. Although not shown in FIG. 4, a shunt capacitor may be added from node H to circuit ground in matching circuit 330.

In general, each matching circuit may include any number of filter stages. More filter stages may provide more filtering and sharper attenuation of unwanted signal components but may also result in more in-band loss. The number of filter stages may be selected to achieve sufficiently low in-band loss and sufficiently high out-of-band attenuation. More filtering may also be achieved by replacing a shunt capacitor (e.g., capacitor 414a, 414b or 440) with a series combination of an inductor and a capacitor.

Output circuit 150 may be implemented in various manners. The coils within matching circuits 310a, 310b and 330 may be implemented with various patterns to obtain the desired inductance and coupling. The coils may also be fabricated on one or more conductive layers.

Figure 5A:
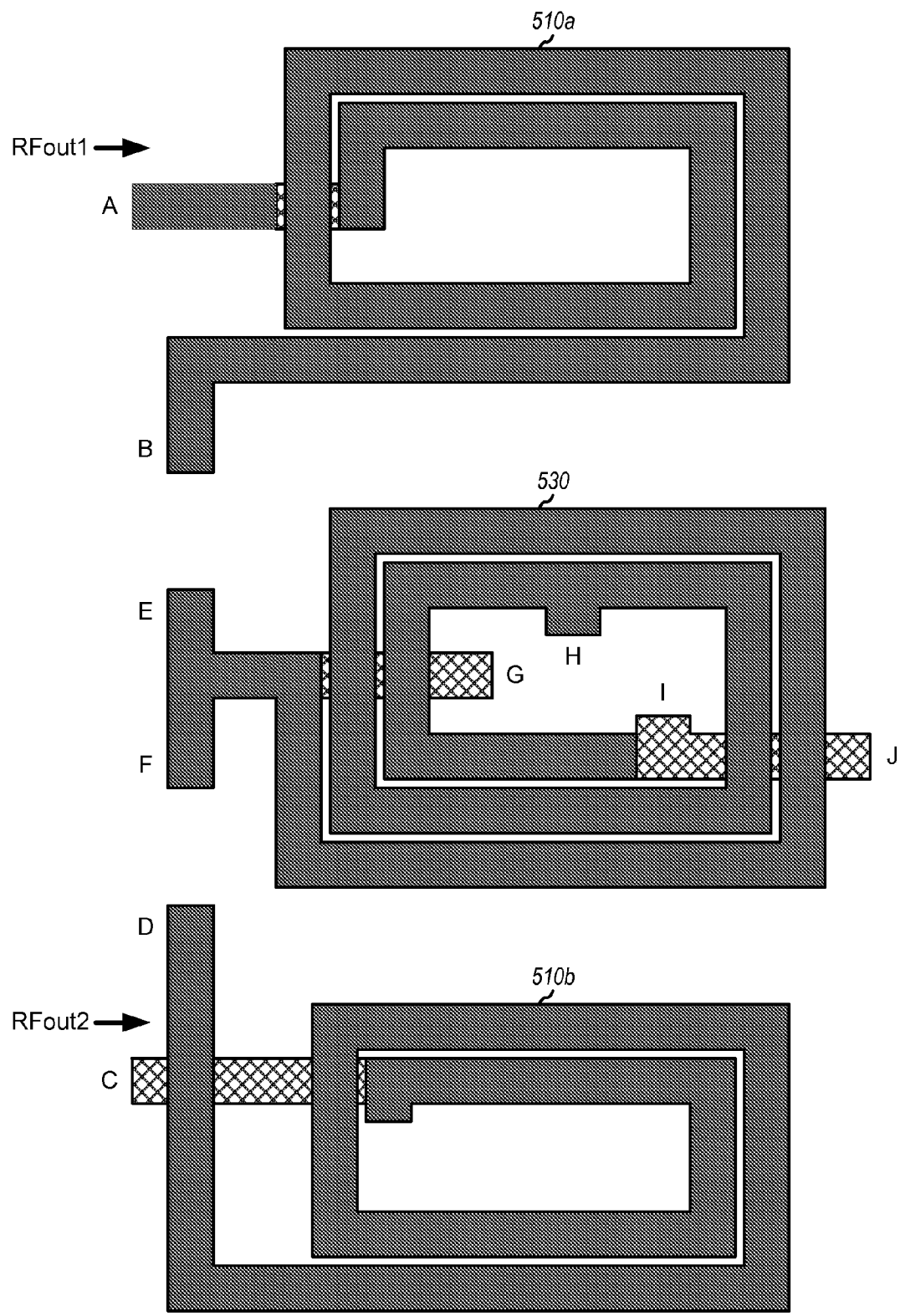
FIGS. 5A and 5B show two layouts of coils within the matching circuits.

FIG. 5A shows a top view of an exemplary design of the coils within matching circuits 310a, 310b and 330 in output circuit 150. In this exemplary design, a conductor 510a implements coil 410a within matching circuit 310a in FIG. 4, a conductor 510b implements coil 410b within matching circuit 310b, and a conductor 530 implements both coils 432 and 434 within matching circuit 330. For clarity, nodes A through J in FIG. 4 are also shown in FIG. 5A. For each conductor, the dark shaded part shows the conductor on one metal layer, and the cross-hashed part shows underpass on another metal layer.

In the exemplary design shown in FIG. 5A, conductor 510a has approximately two turns in a clockwise direction to obtain the desired inductance for coil 410a. Conductor 510b also has approximately two turns in the clockwise direction to obtain the desired inductance for coil 410b. Conductors 510a and 510b should have the same direction in order to allow for combining of the two single-ended output RF signals at nodes E and F in the second transmit mode. Having conductors 510a and 510b in the same direction (e.g., clockwise as shown in FIG. 5A) may result in asymmetry in the layout of conductors 510a and 510b, which may then result in different frequency responses at nodes B and D. Some of the asymmetry may be accounted for with the various capacitors in output circuit 150.

In the exemplary design shown in FIG. 5A, conductor 530 has approximately two and one half turns in a counter-clockwise direction to obtain the desired total inductance for coils 432 and 434. The winding of conductor 530 may be opposite in direction to that of conductors 510a and 510b so that the magnetic coupling coefficients between conductors 530 and 510a and between conductors 530 and 510b are both positive in sign. The positive magnetic coupling may add to the inductance of each coil, thereby increasing the inductance without adding to the resistance, as would be the case if the inductors were increased by lengthening the conductors. The mutual inductance terms for the coupling between conductors 530 and 510a and between conductors 530 and 510b may be exploited to improve filtering of out-of-band harmonics.

An intermediate tap is provided at node H. Coil 432 is implemented with the first portion of conductor 530 from nodes E/F to the intermediate tap, and coil 434 is implemented with the second portion of conductor 530 from the intermediate tap to node J. The location of the intermediate tap may be placed to obtain the desired inductances for coils 432 and 434. Conductor 530 may have the opposite direction as conductors 510a and 510b.

Switch 324 may be coupled between nodes B and E, and switch 326 may be coupled between nodes D and F in FIG. 5A. In general, switches may be coupled to the coils either external to the coils (e.g., at nodes B, E, D, F, etc.) or inside the coils.

FIG. 5A shows an exemplary layout of conductors 510a, 510b and 530 for coils 410a, 410b, 432 and 434. The conductors for the coils may also be implemented with other patterns instead of spiral patterns. For example, each conductor may be implemented with a double spiral, zig-zag, or some other pattern. In general, different topologies, layout patterns, and IC fabrication processes may provide different advantages for the coils.

The layout of conductors 510a, 510b and 530 may take into account various considerations. The coupling between conductors 510a and 510b may have an impact on the filtering of harmonics from power amplifiers 144a and 144b. The mutual inductance between conductors 510a and 510b may determine the amount of attenuation of the harmonics and may be varied by changing the spacing between conductors 510a and 510b. More spacing may result in less mutual inductance, and vice versa. The coupling between conductor 510a and conductor 530 and the coupling between conductor 510b and conductor 530 may also be controlled to obtain the desired performance.

In general, conductors 510a, 510b and 530 may be fabricated with various conductive materials such as a low-loss metal (e.g., copper), a more lossy metal (e.g., aluminum), or some other material. Higher quality factor (Q) may be achieved for a coil fabricated on a low-loss metal layer. A smaller-size coil may be fabricated on a lossy metal layer because different IC design rules may apply. In an exemplary design, conductors 510a, 510b and 530 are fabricated side by side, e.g., as shown in FIG. 5A. In an exemplary design, conductors 510a, 510b and 530 are each fabricated with a metal trace formed on a single metal layer. In another exemplary design, conductors 510a, 510b and 530 are each fabricated with overlapping parallel metal traces formed on multiple metal layers and connected by vias along the metal traces. Using multiple metal traces for each conductor may effectively result in one thick metal trace and may reduce the series resistance of the conductor, which may improve the Q of the conductor. In yet another exemplary design, conductors 510a, 510b and 530 may be fabricated on top of one another on different metal layers (not shown in FIG. 5A).

Figure 5B:
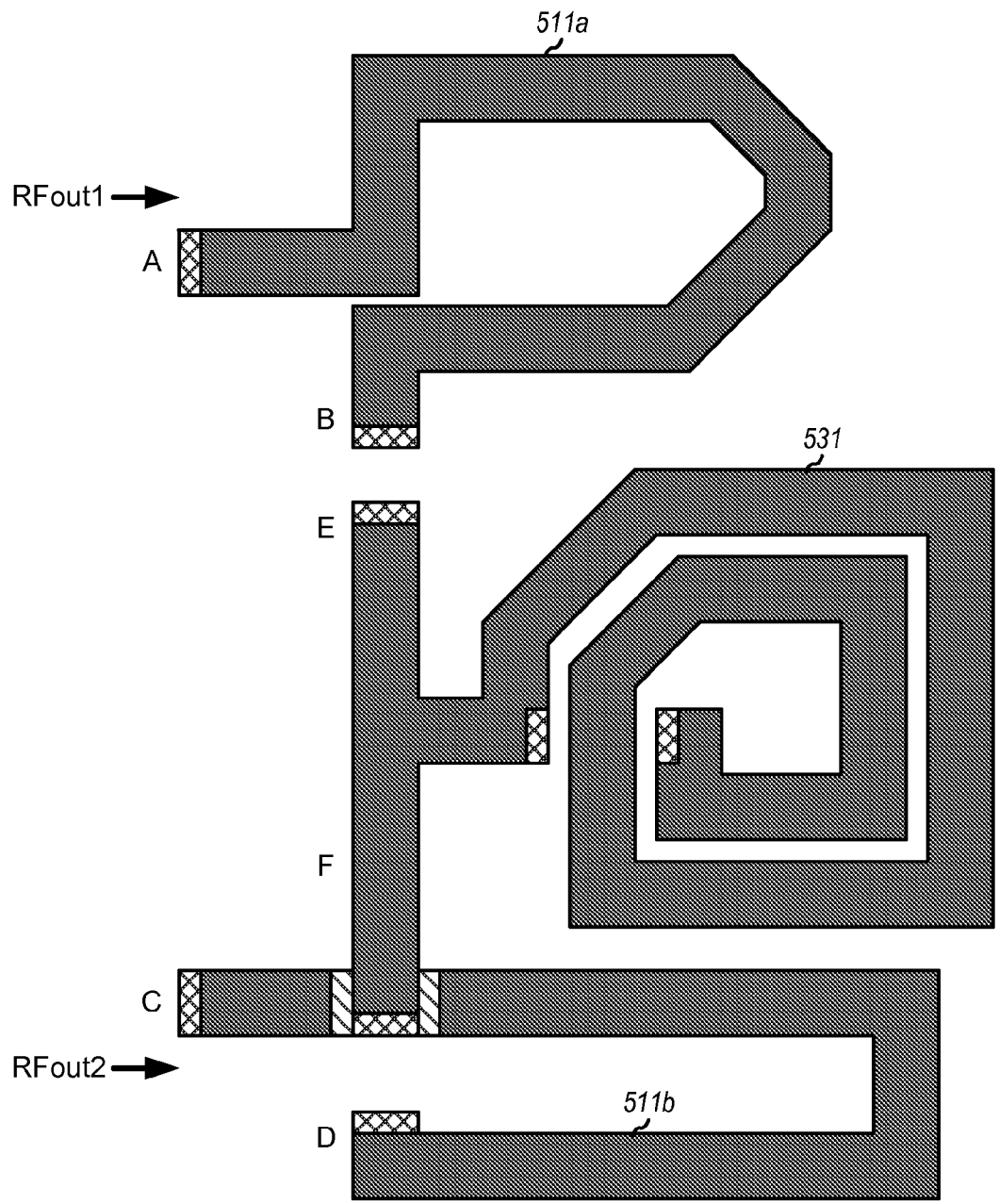

FIG. 5B shows a top view of another exemplary design of the coils within matching circuits 310a, 310b and 330 in output circuit 150. In this exemplary design, a conductor 511a implements coil 410a within matching circuit 310a in FIG. 4, a conductor 511b implements coil 410b within matching circuit 310b, and a conductor 531 implements both coils 432 and 434 within matching circuit 330. In the exemplary design shown in FIG. 5B, conductor 511a has approximately one turn in a clockwise direction to obtain the desired inductance for coil 410a. Conductor 511b also has approximately one turn in the clockwise direction to obtain the desired inductance for coil 410b. Conductor 531 has approximately two turns in the clockwise direction to obtain the desired total inductance for coils 432 and 434. In the exemplary design shown in FIG. 5B, the winding of conductor 531 is in the same direction as that of conductors 511a and 511b. A negative mutual inductance between conductors 511a and 531 and between conductor 511b and 531 may improve second harmonic rejection. The hashed areas at the edges of the conductors are pins for connections to the power amplifier circuit.

FIGS. 5A and 5B show two exemplary designs of the coils within matching circuits 310a, 310b and 330 in output circuit 150. The coils may also be implemented with other designs. The coupling between the coils may be selected to obtain the desired filter responses for the different outputs.

FIGS. 3 & 4 show an exemplary design in which output circuit 150 is coupled to two power amplifiers. In general, an output circuit may be coupled to any number of power amplifiers and may combine the output RF signals from any combination of power amplifiers. The impedance matching by matching circuit 330 may be dependent on the number of power amplifiers being combined. For example, the output impedance may for Zo/2 when two power amplifiers are combined (as shown in FIG. 3), Zo/3 when three power amplifiers are combined, Zo/4 when four power amplifiers are combined, etc.

For clarity, exemplary single-ended designs of the power amplifiers and output circuit have been described above. The power amplifiers and output circuit may also be implemented with differential designs. In one exemplary differential design of the output circuit, the circuits shown in FIG. 4 may be replicated. One copy of the circuits may be used for non-inverted signals, and the other copy of the circuits may be used for inverted signals.

In an exemplary design, the power amplifiers and the output circuit shown in FIGS. 1 to 4 may be used for one frequency band, e.g., cellular band, or PCS band, or some other frequency band. In an exemplary design, the power amplifiers and the output circuit shown in FIGS. 1 to 4 may be replicated for each supported frequency band. For example, one set of power amplifiers and output circuit may be used for cellular band, another set of power amplifiers and output circuit may be used for PCS band, etc. The power amplifiers and output circuit in each set may be designed for its frequency band.

As described above, output circuit 150 may perform various functions including:

Provide impedance matching—the input impedance may be low (e.g., approximately 4 ohms for Zp1 and Zp2), and the output impedance may be standard 50 ohm, Combine the power of multiple power amplifiers by adding their output RF signals to generate one high-power combined output RF signal, Have low in-band loss by minimize the path length and number of components, Attenuate harmonics, e.g., provide 35 dB or more of harmonic attenuation, Support multiple transmit modes with switches and tap points, Operate without combining by providing the output RF signal from each power amplifier in lower-power modes of operation, Allow for tuning of circuit response with capacitors without having to change layout, and Compact design—suitable for on-chip implementation.

Figure 6:
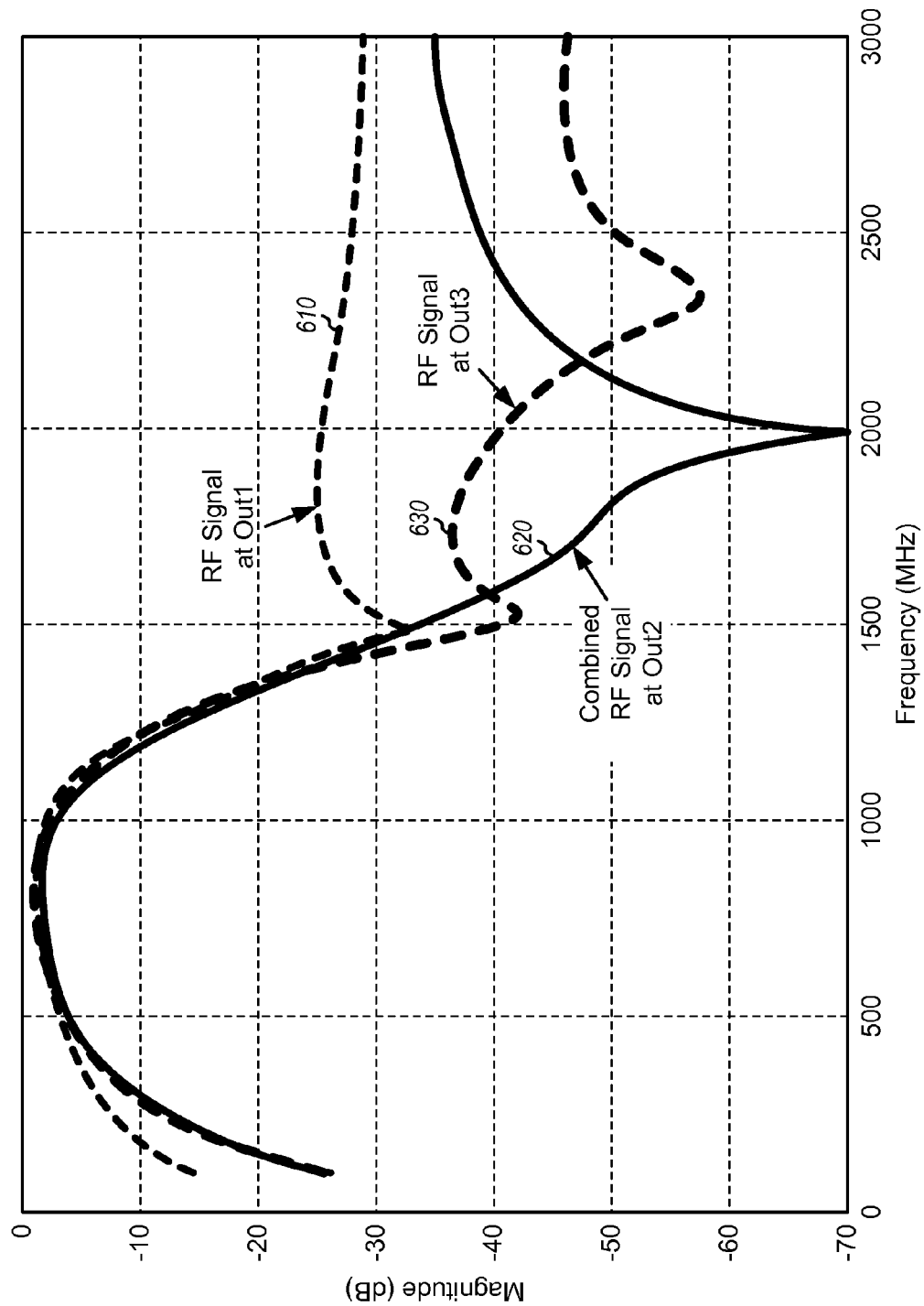
FIG. 6 shows plots of the responses at different outputs of the output circuit.

FIG. 6 shows plots of an exemplary design of power amplifiers 144a and 144b and output circuit 150 in FIGS. 2 to 4 for cellular band. A plot 610 shows a frequency response of the output RF signal from power amplifier 144a at the first output (Out1) of output circuit 150, with filtering provided by matching circuit 310a. A plot 620 shows a frequency response of the combined output RF signal from power amplifiers 144a and 144b at the second output (Out2) of output circuit 150, with filtering provided by matching circuits 310a, 310b and 330. A plot 630 shows a frequency response of the output RF signal from power amplifier 144b at the third output (Out3) of output circuit 150, with filtering provided by matching circuit 310b. As shown in FIG. 6, relatively low insertion loss is achieved in-band around 900 MHz, and stopband attenuation of 35 dB or more is achieved for all three outputs from 1.7 GHz and above.

FIG. 6 shows frequency responses of the three outputs of output circuit 150 for an exemplary design. The frequency responses of the three outputs may be different from the frequency responses shown in FIG. 6 depending on the design of output circuit 150.

The output circuit described herein may be used with power amplifiers, as described above. The output circuit may also be used with other circuits. For example, the output circuit may be used with filters, amplifiers, mixers, etc.

In an exemplary design, an apparatus may comprise a first circuit, a second circuit, and an output circuit. The first and second circuits may comprise first and second power amplifiers, respectively, or circuits of other types. The first circuit may provide a first single-ended signal (e.g., RFout1 in FIG. 4) and may have a first output impedance (e.g., Zp1). The second circuit may provide a second single-ended signal (e.g., RFout2) and may have a second output impedance (e.g., Zp2). The output circuit may be coupled to the first and second circuits and may perform output impedance matching for the first and second circuits, may combine the first and second single-ended signals to obtain a combined single-ended signal, and may perform impedance matching for the combined single-ended signal. The output circuit may further filter the first and second single-ended signals prior to combining and may also filter the combined single-ended signal.

In an exemplary design, the output circuit may comprise first and second matching circuits. The first matching circuit (e.g., matching circuit 310a in FIG. 4) may be coupled to the first circuit and may perform output impedance matching for the first circuit. The first matching circuit may further filter the first single-ended signal from the first circuit. The second matching circuit (e.g., matching circuit 310b in FIG. 4) may be coupled to the second circuit and may perform output impedance matching for the second circuit. The second matching circuit may further filter the second single-ended signal from the second circuit. The first and second matching circuits may also be coupled through mutual inductance and/or mutual capacitance. The output circuit may further comprise a third matching circuit (e.g., matching circuit 330 in FIG. 4) that may perform impedance matching for the combined single-ended signal and may further filter the combined single-ended signal. Each matching circuit may comprise a coil coupled between an input and an output of the matching circuit, a first capacitor coupled in parallel with the coil, and a second capacitor coupled between the output of the matching circuit and circuit ground. A matching circuit may further comprise one or more additional coils and one or more additional capacitors to implement one or more additional filter stages.

In an exemplary design, the first matching circuit may comprise a first coil (e.g., coil 410a) formed with a first conductor (e.g., conductor 510a) arranged in a first direction. The second matching circuit may comprise a second coil (e.g., coil 410b) formed with a second conductor (e.g., conductor 510b) arranged in the first direction. The third matching circuit may comprise at least one coil formed with a third conductor arranged in a second direction opposite of the first direction. For example, the third matching circuit may comprise third and fourth coils (e.g., coils 432 and 434) formed with the third conductor (e.g., conductor 530) having an intermediate tap. The third coil may be formed by a first part of the third conductor from an input of the third conductor to the intermediate tap. The fourth coil may be formed by a second part of the third conductor from the intermediate tap to an output of the third conductor.

The output circuit may comprise a combiner for summing the first and second single-ended signals. The combiner may be a summing node, which may be suitable for combining single-ended signals, e.g., as shown in FIGS. 3 and 4, or current signals.

The output circuit may provide the first single-ended signal to a first output, the combined single-ended signal to a second output, or the second single-ended signal to a third output. The output circuit may further comprise a first switch coupled between the first matching circuit and the first output, a second switch coupled between the first and third matching circuits, a third switch coupled between the second and third matching circuits, and a fourth switch coupled between the second matching circuit and the third output.

In an exemplary design, the first circuit, the second circuit, and the output circuit may be implemented on a single IC. For example, the first and second circuits may comprise first and second power amplifiers implemented with MOS transistors, and the power amplifiers and the output circuit may be implemented on a CMOS IC.

In an exemplary design, the apparatus may further include one or more additional circuits (e.g., power amplifiers) coupled to the first circuit. The output circuit may include an additional matching circuit for each additional circuit. The third matching circuit may couple to the additional matching circuit(s) and may combine the outputs of the additional circuit(s).

Figure 7:
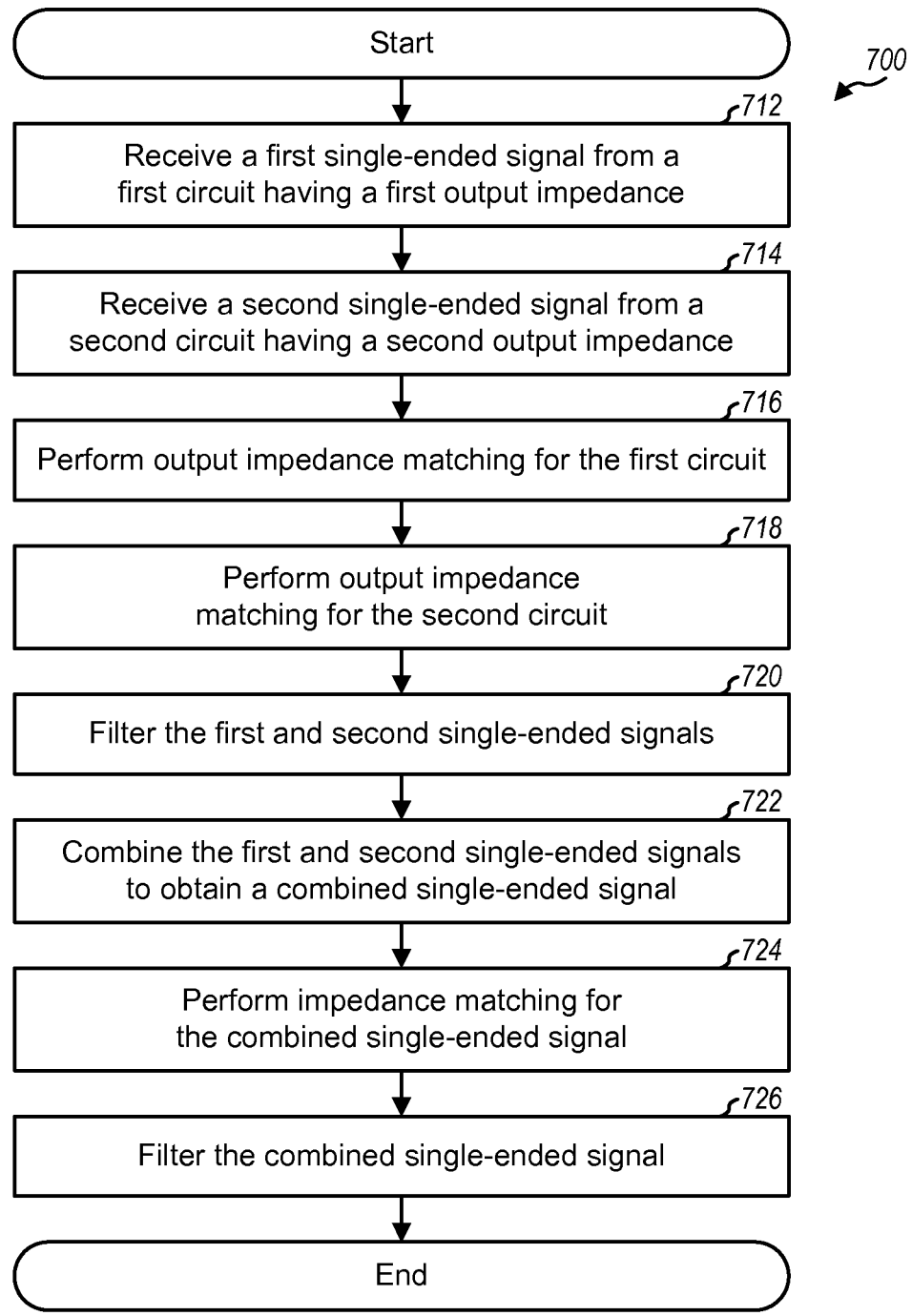
FIG. 7 shows a process for outputting signals.

FIG. 7 shows an exemplary design of a process 700 for outputting signals. A first single-ended signal from a first circuit (e.g., a first power amplifier) having a first output impedance may be received (block 712). A second single-ended signal from a second circuit (e.g., a second power amplifier) having a second output impedance may also be received (block 714). Output impedance matching may be performed for the first circuit (block 716). Output impedance matching may also be performed for the second circuit (block 718). The first and second single-ended signals may also be filtered, e.g., concurrent with the output impedance matching (block 720). The first and second single-ended signals may be combined to obtain a combined single-ended signal (block 722). Impedance matching may be performed for the combined single-ended signal (block 724). The combined single-ended signal may also be filtered, e.g., concurrent with the impedance matching (block 726).

All or a subset of the steps in process 700 may be performed, depending on the desired output signal. For example, only the steps in blocks 712 and 716 and part of block 720 may be performed if the first single-ended signal is to be outputted. Only the steps in blocks 714 and 718 and part of block 720 may be performed if the second single-ended signal is to be outputted. The steps in blocks 712 to 726 may be performed if the combined single-ended signal is to be outputted.

The first single-ended signal may be provided to a first output in a first mode. The combined single-ended signal may be provided to a second output in a second mode. The third single-ended signal may be provided to a third output in a third mode.

The output circuit and power amplifiers described herein may be implemented on an IC, an analog IC, an RFIC, a mixed-signal IC, an ASIC, a printed circuit board (PCB), an electronics device, etc. The output circuit and power amplifiers may also be fabricated with various IC process technologies such as CMOS, NMOS, P-channel MOS (PMOS), bipolar junction transistor (BJT), bipolar-CMOS (BiCMOS), silicon germanium (SiGe), gallium arsenide (GaAs), etc.

An apparatus implementing the output circuit and power amplifiers described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
an output circuit coupled to a first circuit and a second circuit, the first circuit providing a first single-ended signal and having a first output impedance, the second circuit providing a second single-ended signal and having a second output impedance, the output circuit performing output impedance matching for the first and second circuits, selectably combining the first and second single-ended signals to obtain a combined single-ended signal, and performing impedance matching for the combined single-ended signal.

2. The apparatus of claim 1, the first circuit comprising a first power amplifier, and the second circuit comprising a second power amplifier.

3. The apparatus of claim 1, the output circuit further filtering the first and second single-ended signals prior to combining and filtering the combined single-ended signal.

4. The apparatus of claim 1, the output circuit comprising
a first matching circuit coupled to the first circuit and performing output impedance matching for the first circuit, and
a second matching circuit coupled to the second circuit and performing output impedance matching for the second circuit.

5. The apparatus of claim 4, the first matching circuit further filtering the first single-ended signal from the first circuit, and the second matching circuit further filtering the second single-ended signal from the second circuit.

6. The apparatus of claim 4, the first and second matching circuits each comprising
a coil coupled between an input and an output of the matching circuit,
a first capacitor coupled in parallel with the coil, and
a second capacitor coupled between the output of the matching circuit and circuit ground.

7. The apparatus of claim 4, the output circuit further comprising
a third matching circuit performing impedance matching for the combined single-ended signal.

8. The apparatus of claim 7, the third matching circuit further filtering the combined single-ended signal.

9. The apparatus of claim 7, the third matching circuit comprising
a first coil coupled between an input and an output of the third matching circuit,
a first capacitor coupled in parallel with the first coil, and
a second capacitor coupled between the output of the third matching circuit and circuit ground.

10. The apparatus of claim 9, the third matching circuit further comprising
a second coil coupled in series with the first coil and between the input and the output of the third matching circuit, and
a third capacitor coupled in parallel with the second coil.

11. The apparatus of claim 7, the first matching circuit comprising a first coil formed with a first conductor arranged in a first direction, and the second matching circuit comprising a second coil formed with a second conductor arranged in the first direction.

12. The apparatus of claim 11, the third matching circuit comprising at least one coil formed with a third conductor arranged in a second direction opposite of the first direction.

13. The apparatus of claim 11, the third matching circuit comprising at least one coil formed with a third conductor arranged in the first direction.

14. The apparatus of claim 11, the third matching circuit comprising third and fourth coils formed with a third conductor having an intermediate tap, the third coil being formed by a first part of the third conductor from an input of the third conductor to the intermediate tap, and the fourth coil being formed by a second part of the third conductor from the intermediate tap to an output of the third conductor.

15. The apparatus of claim 7, the first matching circuit comprising a first coil formed with a first conductor, the second matching circuit comprising a second coil formed with a second conductor, and the third matching circuit comprising a third coil formed with a third conductor, each conductor being fabricated with multiple metal traces formed on multiple metal layers and connected by vias along the metal traces.

16. The apparatus of claim 1, the output circuit further providing the first single-ended signal to a first output or providing the combined single-ended signal to a second output.

17. The apparatus of claim 7, the output circuit further comprising
a first switch coupled between the first matching circuit and a first output,
a second switch coupled between the first and third matching circuits, and
a third switch coupled between the second and third matching circuits, the third matching circuit being coupled to a second output.

18. The apparatus of claim 17, the output circuit further comprising a fourth switch coupled between the second matching circuit and a third output.

19. The apparatus of claim 1, the first circuit, the second circuit, and the output circuit being implemented on a single integrated circuit (IC).

20. The apparatus of claim 2, the first and second power amplifiers being implemented with metal oxide semiconductor (MOS) transistors, and the first and second power amplifiers and the output circuit being implemented on a complementary metal oxide semiconductor (CMOS) integrated circuit (IC).

21. An integrated circuit comprising:
a first power amplifier providing a first single-ended radio frequency (RF) signal and having a first output impedance;
a second power amplifier providing a second single-ended RF signal and having a second output impedance; and
an output circuit coupled to the first and second power amplifiers and performing output impedance matching for the first and second power amplifiers, selectably combining the first and second single-ended RF signals to obtain a combined single-ended RF signal, and performing impedance matching for the combined single-ended RF signal.

22. The integrated circuit of claim 21, the output circuit comprising
a first matching circuit coupled to the first power amplifier and performing output impedance matching for the first power amplifier, and
a second matching circuit coupled to the second power amplifier and performing output impedance matching for the second power amplifier.

23. The integrated circuit of claim 22, the output circuit further comprising
a third matching circuit performing impedance matching for the combined single-ended RF signal.

24. The integrated circuit of claim 23, the first, second and third matching circuits each comprising
a coil coupled between an input and an output of the matching circuit,
a first capacitor coupled in parallel with the coil, and
a second capacitor coupled between the output of the matching circuit and circuit ground.

25. The integrated circuit of claim 23, the output circuit further comprising
a first switch coupled between the first matching circuit and a first output,
a second switch coupled between the first and third matching circuits, and a third switch coupled between the second and third matching circuits, the third matching circuit being coupled to a second output.

26. A method comprising:
receiving a first single-ended signal from a first circuit having a first output impedance;
receiving a second single-ended signal from a second circuit having a second output impedance;
performing output impedance matching for the first circuit;
performing output impedance matching for the second circuit;
selectably combining the first and second single-ended signals to obtain a combined single-ended signal; and
performing impedance matching for the combined single-ended signal.

27. The method of claim 26, further comprising:
filtering the first and second single-ended signals prior to combining; and
filtering the combined single-ended signal.

28. The method of claim 26, further comprising:
providing the first single-ended signal to a first output in a first mode; and
providing the combined single-ended signal to a second output in a second mode.

29. An apparatus comprising:
means for receiving a first single-ended signal from a first circuit having a first output impedance;
means for receiving a second single-ended signal from a second circuit having a second output impedance;
means for performing output impedance matching for the first circuit;
means for performing output impedance matching for the second circuit;
means for selectably combining the first and second single-ended signals to obtain a combined single-ended signal; and
means for performing impedance matching for the combined single-ended signal.

30. The apparatus of claim 29, further comprising:
means for filtering the first and second single-ended signals prior to combining; and
means for filtering the combined single-ended signal.

31. The apparatus of claim 29, further comprising:
means for providing the first single-ended signal to a first output in a first mode; and
means for providing the combined single-ended signal to a second output in a second mode.

* * * * *